(12) United States Patent
Shiokawa

(10) Patent No.: US 11,005,443 B2
(45) Date of Patent: May 11, 2021

(54) MULTILAYER BALUN

(71) Applicant: Murata Manufacturing Co., Ltd., Nagaokakyo (JP)

(72) Inventor: Noboru Shiokawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/715,752

(22) Filed: Dec. 16, 2019

(65) Prior Publication Data

US 2020/0119708 A1 Apr. 16, 2020

Related U.S. Application Data

(63) Continuation of application No. PCT/JP2018/019622, filed on May 22, 2018.

(30) Foreign Application Priority Data

Jun. 30, 2017 (JP) .............................. JP2017-129509

(51) Int. Cl.
| | | |
|---|---|---|
| H03H 7/42 | (2006.01) |
| H03H 7/09 | (2006.01) |
| H03H 7/01 | (2006.01) |
| H03H 1/00 | (2006.01) |

(52) U.S. Cl.
CPC ............ *H03H 7/42* (2013.01); *H03H 7/0115* (2013.01); *H03H 7/09* (2013.01); *H03H 2001/0085* (2013.01)

(58) Field of Classification Search
CPC ..... H03H 2001/0085; H03H 7/09; H03H 7/42
USPC ................................................. 333/175, 185
See application file for complete search history.

(56) References Cited

U.S. PATENT DOCUMENTS

| | | | |
|---|---|---|---|
| 8,018,297 B2 | 9/2011 | Aoki | |
| 8,482,366 B2 | 7/2013 | Taniguchi | |
| 2007/0120637 A1 | 5/2007 | Ezzeddine | |
| 2009/0243749 A1* | 10/2009 | Rofougaran | H01P 5/10 333/25 |
| 2010/0007430 A1 | 1/2010 | Aoki | |
| 2010/0033241 A1 | 2/2010 | Mori et al. | |
| 2010/0283557 A1* | 11/2010 | Taniguchi | H03H 7/0115 333/204 |

(Continued)

FOREIGN PATENT DOCUMENTS

| | | |
|---|---|---|
| JP | 2006-253877 A | 9/2006 |
| JP | 2007-110271 A | 4/2007 |

(Continued)

OTHER PUBLICATIONS

Official Communication issued in International Patent Application No. PCT/JP2018/019622, dated Aug. 7, 2018.

*Primary Examiner* — Rakesh B Patel
(74) *Attorney, Agent, or Firm* — Keating & Bennett, LLP

(57) ABSTRACT

A multilayer balun includes first, second, and third terminals, first and second inductors, and an open line conductor. The first inductor is electrically connected between the first terminal and ground points. The second inductor is electrically connected between the second terminal and the third terminal and is magnetically coupled with the first inductor. The open line conductor has one end that is an open end and another end that is electrically connected to a via conductor pattern, which is a signal path between the first terminal and ground points.

18 Claims, 4 Drawing Sheets

(56) References Cited

U.S. PATENT DOCUMENTS

2011/0140806 A1    6/2011  Taniguchi
2011/0169586 A1*   7/2011  Taniguchi ............ H03H 7/0115
                                                         333/25

FOREIGN PATENT DOCUMENTS

JP      2010-021928 A    1/2010
JP      2011-124880 A    6/2011
WO      2008/068809 A1   6/2006

* cited by examiner

100

MULTILAYER BALUN

CROSS REFERENCE TO RELATED APPLICATIONS

This application claims the benefit of priority to Japanese Patent Application No. 2017-129509 filed on Jun. 30, 2017 and is a Continuation Application of PCT Application No. PCT/JP2018/019622 filed on May 22, 2018. The entire contents of each application are hereby incorporated herein by reference.

BACKGROUND OF THE INVENTION

1. Field of the Invention

The present invention relates to a multilayer balun in which a plurality of dielectric layers are stacked in a stacking direction.

2. Description of the Related Art

Heretofore, a multilayer balun in which a plurality of dielectric layers are stacked in a stacking direction is known. For example, Japanese Unexamined Patent Application Publication No. 2011-124880 discloses a multilayer balance filter.

In the multilayer balance filter disclosed in Japanese Unexamined Patent Application Publication No. 2011-124880, an attenuation pole at which the attenuation amount of a signal is maximum is generated in a frequency band that is higher than a used frequency band (pass band).

In some cases, it is possible to make the frequency characteristics of the multilayer balun more suitable for the application of the multilayer balun by adjusting the frequency of the attenuation pole. The frequency of the attenuation pole can be adjusted by changing the inductance of an inductor or the capacitance of a capacitor included in the multilayer balun.

The inductance of the inductor or the capacitance of the capacitor included in the multilayer balun is adjusted so that the pass band of the multilayer balun comes to be a desired frequency band. When either of these characteristics is changed, the pass band of the multilayer balun may deviate from the desired frequency band. It is often difficult to adjust the frequency of the attenuation pole while maintaining the pass band of the multilayer balun.

SUMMARY OF THE INVENTION

Preferred embodiments of the present invention provide an adjustment to the frequency of an attenuation pole while maintaining the pass band of a multilayer balun.

In a multilayer balun according to a preferred embodiment of the present invention, a plurality of dielectric layers are stacked in a stacking direction. The multilayer balun includes first to third terminals, first and second inductors, and an open line conductor. The first inductor is electrically connected between the first terminal and a ground point. The second inductor is electrically connected between the second terminal and the third terminal and is magnetically coupled with the first inductor. The open line conductor includes one end that is an open end and another end that is electrically connected to a signal path between the first terminal and the ground point.

In a multilayer balun according to a preferred embodiment the present invention, the frequency of an attenuation pole in a frequency band that is higher than the pass band is changed by the open line conductor. Furthermore, since the one end of the open line conductor is an open end, the inductance component of the open line conductor is smaller than the inductance of the first inductor. The self-resonant frequency of the open line conductor is higher than the resonant frequency of the multilayer balun, and therefore the open line conductor negligibly affects a signal in the pass band of the multilayer balun.

According to multilayer baluns according to preferred embodiments of the present invention, the frequency of an attenuation pole can be adjusted while maintaining the pass band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, preferred embodiments of the present invention will be described in detail with reference to the drawings. In the figures, the same or corresponding portions are denoted by the same symbols and description thereof is generally not repeated.

Figure 1:
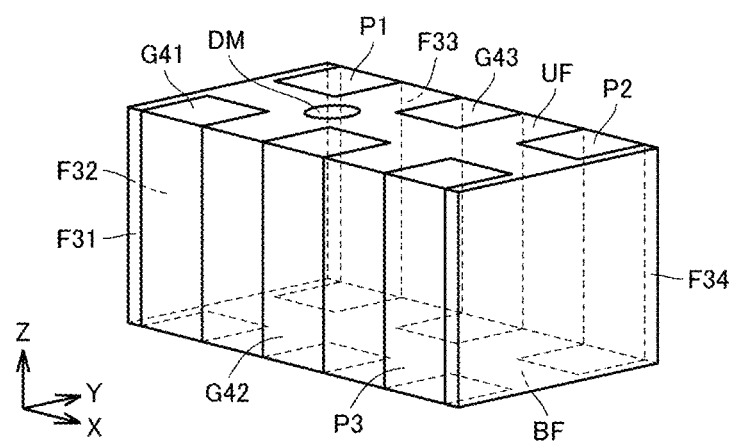
FIG. 1 is an external perspective view of a multilayer balun according to a preferred embodiment of the present invention.

FIG. 1 is an external perspective view of a multilayer balun 100 according to a preferred embodiment of the present invention. As shown in FIG. 1, the multilayer balun 100 has a rectangular parallelepiped shape or a substantially rectangular parallelepiped shape, for example. The multilayer balun 100 is a multilayer body in which a plurality of dielectric layers are stacked in a stacking direction (Z-axis direction). A bottom surface BF and a top surface UF are surfaces that are perpendicular or substantially perpendicular to the Z-axis direction. Side surfaces F31 and F33 are parallel or substantially parallel to a ZX plane among planes parallel or substantially parallel to the stacking direction. Side surfaces F32 and F34 are parallel or substantially parallel to a YZ plane among planes parallel or substantially parallel to the stacking direction. Terminals P1 and P2 and a ground terminal G43 are provided on the top surface UF, the side surface F33, and the bottom surface BF. Ground terminals G41 and G42 and a terminal P3 are provided on the top surface UF, the side surface F31, and the bottom surface BF. A direction identifying mark DM that identifies the mounting direction of the multilayer balun 100 is provided on the top surface UF. The bottom surface BF is electrically connected to a substrate, which is not shown.

The terminal P1 is an unbalanced signal terminal. The terminal P1 is electrically connected to an antenna, which is not shown, for example. The terminals P2 and P3 are balanced signal terminals. The terminals P2 and P3 are electrically connected to an RF circuit, which is not shown, for example. The difference between the phase of a signal output from the terminal P2 and the phase of a signal output from the terminal P3 is 180°. The difference between the phase of a signal input to the terminal P2 and the phase of a signal input to the terminal P3 is 180°.

Figure 2:
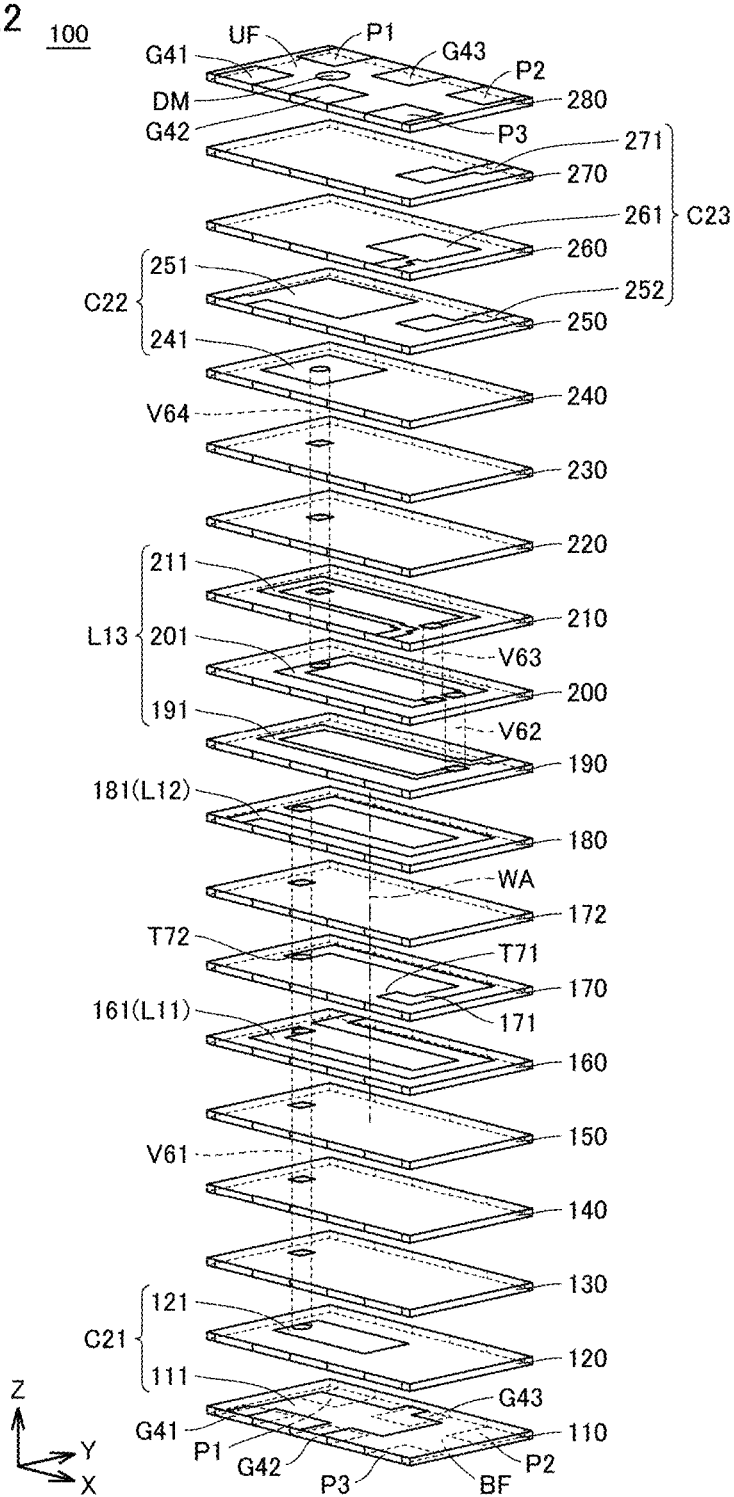
FIG. 2 is an exploded perspective view showing an example of the multilayer structure of the multilayer balun in FIG. 1.

FIG. 2 is an exploded perspective view showing an example of the multilayer structure of the multilayer balun 100 in FIG. 1. As shown in FIG. 2, a dielectric layer 110 includes the bottom surface BF. A capacitor conductor pattern 111 is provided on the dielectric layer 110. The capacitor conductor pattern 111 is electrically connected to the ground terminals G41 and G42. A capacitor conductor pattern 121 is provided on a dielectric layer 120. The capacitor conductor patterns 111 and 121 define a capacitor C21.

Dielectric layers 130, 140, and 150 are arranged between the dielectric layer 120 and a dielectric layer 160. An inductor conductor pattern 161 is provided on the dielectric layer 160. The inductor conductor pattern 161 is electrically connected to the terminal P1. The inductor conductor pattern 161 defines an inductor L11. The inductor conductor pattern 161 is electrically connected to the capacitor conductor pattern 121 by a via conductor pattern V61.

An open line conductor pattern 171 is provided on a dielectric layer 170. One end T71 of the open line conductor pattern 171 is an open end. Another end T72 of the open line conductor pattern 171 is electrically connected to the inductor conductor pattern 161 by the via conductor pattern V61.

A dielectric layer 172 is arranged between dielectric layers 170 and 180. An inductor conductor pattern 181 is provided on the dielectric layer 180. The inductor conductor pattern 181 is electrically connected to the ground terminal G41. The inductor conductor pattern 181 defines an inductor L12. The inductor conductor pattern 181 is electrically connected to the other end T72 of the open line conductor pattern 171 by the via conductor pattern V61.

The other end T72 of the open line conductor pattern 171 is electrically connected to the via conductor pattern V61, which is a signal path between the terminal P1 and the ground terminal G41. The inductor conductor patterns 161 and 181 and the open line conductor pattern 171 wind around an axis WA that extends in the stacking direction. An inductance component is increased as a result of the open line conductor pattern 171 winding around the axis WA. The open line conductor pattern 171 faces the inductor conductor patterns 161 and 181 in the stacking direction. Capacitances are generated between the open line conductor pattern 171 and the inductor conductor patterns 161 and 181.

An inductor conductor pattern 191 is provided on a dielectric layer 190. The inductor conductor pattern 191 is electrically connected to the terminal P2. An inductor conductor pattern 201 is provided on a dielectric layer 200. The inductor conductor pattern 201 is electrically connected to the inductor conductor pattern 191 by a via conductor pattern V62. An inductor conductor pattern 211 is provided on a dielectric layer 210. The inductor conductor pattern 211 is electrically connected to the terminal P3. The inductor conductor pattern 211 is electrically connected to the inductor conductor pattern 201 by a via conductor pattern V63. The inductor conductor patterns 191, 201, and 211 define an inductor L13.

Dielectric layers 220 and 230 are arranged between dielectric layers 210 and 240. A capacitor conductor pattern 241 is provided on the dielectric layer 240. The capacitor conductor pattern 241 is electrically connected to the inductor conductor pattern 201 by a via conductor pattern V64. Capacitor conductor patterns 251 and 252 are provided on a dielectric layer 250. The capacitor conductor pattern 251 is electrically connected to the ground terminal G41. The capacitor conductor patterns 241 and 251 define a capacitor C22. The capacitor conductor pattern 252 is electrically connected to the terminal P2.

A capacitor conductor pattern 261 is provided on a dielectric layer 260. The capacitor conductor pattern 261 is electrically connected to the terminal P3. A capacitor conductor pattern 271 is provided on a dielectric layer 270. The capacitor conductor pattern 271 is electrically connected to the terminal P2. The capacitor conductor patterns 252, 261, and 271 define a capacitor C23. A dielectric layer 280 includes the top surface UF.

The inductors L11 and L12 are electrically connected in series with each other between the terminal P1 and ground points (ground terminals G41 and G42). The capacitor C21 is electrically connected in series with the inductor L11 between the terminal P1 and a ground point. The capacitor C21 is electrically connected in parallel with the inductor L12 between the inductor L11 and a ground point. The inductor L12 and the capacitor C21 define an LC parallel resonator. The resonant frequency of the LC parallel resonator is a frequency f91.

The inductor L11 and the capacitor C21 define a low pass filter. The low pass filter reduces harmonic waves of a signal of the pass band. A harmonic wave of a signal is a signal having a frequency that is an integer multiple of the frequency of the signal. Examples of a source of harmonic waves include an antenna, which is not shown, that is electrically connected to the terminal P1 and an RF circuit, which is not shown, that is electrically connected to the terminals P2 and P3.

The inductor L13 is electrically connected between the terminals P2 and P3. The inductor L13 is magnetically coupled with the inductors L11 and L12. The capacitor C22 is electrically connected between a middle portion located between the two end portions of the inductor L13, and a ground point (ground terminal G41). The capacitor C23 is electrically connected in parallel with the inductor L13 between the terminals P2 and P3. The inductor L13 and the capacitor C23 define an LC parallel resonator. The resonant frequency of the LC resonator is a frequency f92. The frequency f92 is equal or substantially equal to the frequency f91.

The pass band of the multilayer balun 100 includes the frequencies f91 and f92. An unbalanced signal of the pass band that is input to the terminal P1 is transmitted to the inductor L13 via magnetic coupling from the inductors L11 and L12. The phase difference between signals output from the two end portions of the inductor L13 is 180°. Balanced signals of the pass band are output from the terminals P2 and P3.

Balanced signals of the pass band that are input to the terminals P2 and P3 are input to the two end portions of the inductor L13 and are transmitted from the inductor L13 to the inductors L11 and L12 via magnetic coupling as an unbalanced signal. The unbalanced signal is output from the terminal P1.

In the multilayer balun 100, an inductor layer (dielectric layer 180) on which the inductor L12 is provided is arranged between a conductor layer (dielectric layer 170) on which the open line conductor pattern 171 is provided and inductor layers (dielectric layers 190 to 210) on which the inductor L13 is provided. In the multilayer balun 100, the inductor L12 of the LC parallel resonator is closer to the inductor L13, which is electrically connected to the balanced signal terminals P2 and P3, than the open line conductor pattern 171 in the stacking direction.

Figure 3:
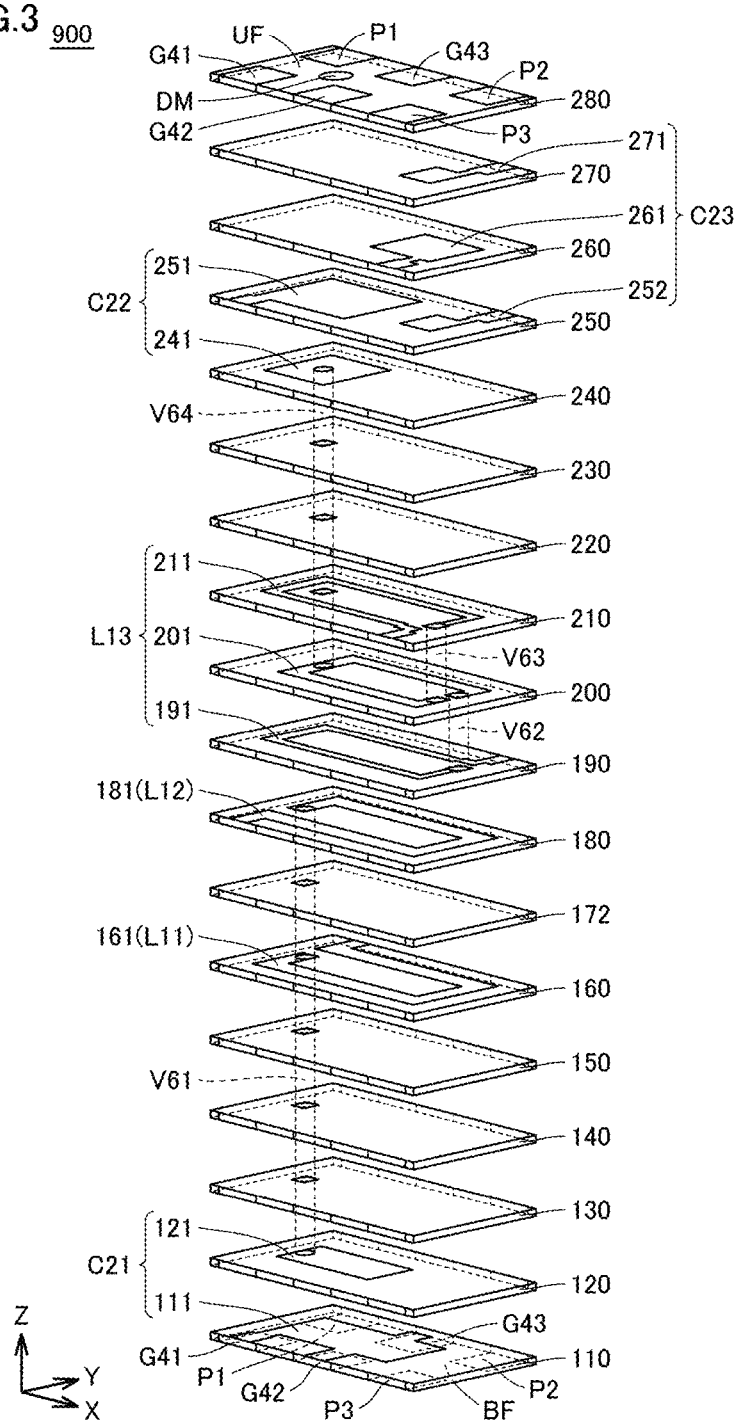
FIG. 3 is an exploded perspective view showing an example of the multilayer structure of a multilayer balun according to a comparative example.

FIG. 3 is an exploded perspective view showing an example of the multilayer structure of a multilayer balun 900 according to a comparative example. The multilayer structure of the multilayer balun 900 shown in FIG. 3 is a structure provided by removing the dielectric layer 170 from the multilayer structure of the multilayer balun 100 shown in FIG. 2. The rest of the structure is the same or substantially the same and therefore description thereof will not be repeated.

In the multilayer balun 900, an attenuation pole at which the attenuation amount of a signal is substantially maximum is generated in a frequency band that is higher than the pass band. In some cases, it is possible to make the frequency characteristics of the multilayer balun 900 more suitable for the application of the multilayer balun 900 by adjusting the frequency of the attenuation pole. For example, an attenuation pole may be provided in order to attenuate a harmonic wave component at a center frequency of the pass band or in order to attenuate the frequency of a signal other than a signal that is to be used. The frequency of the attenuation pole can be adjusted by changing the inductances of the inductors L11 to L13 or the capacitances of the capacitors C21 to C23 included in the multilayer balun 900.

The inductances of the inductors L11 to L13 or the capacitances of the capacitors C21 to C23 are adjusted so that the pass band of the multilayer balun 900 comes to be a predetermined frequency band. When the inductances of the inductors or the capacitances of the capacitors included in the multilayer balun are changed, the pass band of the multilayer balun 900 may deviate from the predetermined frequency band.

In the multilayer balun 100 according to the present preferred embodiment, the open line conductor pattern 171 is provided on the dielectric layer 170. The frequency of the attenuation pole of the multilayer balun 100 is changed by the open line conductor pattern 171. In addition, since the one end T71 is an open end, the inductance component of the open line conductor pattern 171 is smaller than the inductance of the inductor L12. The self-resonant frequency of the open line conductor pattern 171 is higher than the resonant frequency of the multilayer balun 100, and therefore the open line conductor pattern 171 negligibly affects a signal of the pass band of the multilayer balun 100.

In addition, in the multilayer balun 100, the open line conductor pattern 171 winds around the axis WA, which is the winding axis of the inductor L11, and thus an inductance component is intentionally provided. Furthermore, the open line conductor pattern 171 faces the inductors L11 and L12 in the stacking direction, and therefore a capacitance component is also intentionally provided. The frequency of the attenuation pole of the multilayer balun 100 can be changed by a greater amount using the inductance component and the capacitance component of the open line conductor pattern 171.

Figure 4:
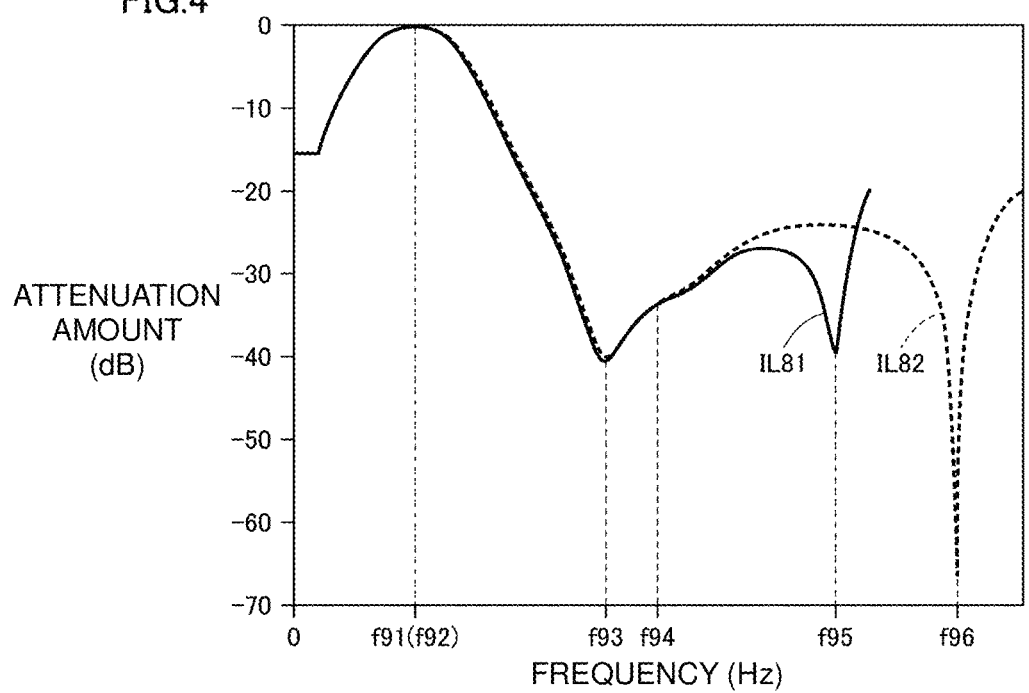
FIG. 4 shows the insertion loss of the multilayer balun in FIG. 2 and the insertion loss of the multilayer balun in FIG. 3.

FIG. 4 shows an insertion loss IL81 of the multilayer balun 100 in FIG. 2 and an insertion loss IL82 of the multilayer balun 900 in FIG. 3. The attenuation amount (dB) on the vertical axis in FIG. 4 is expressed as negative values. The insertion loss increases as the absolute value of the attenuation amount increases. Insertion loss is a parameter representing the proportion of a signal, out of a signal input to a certain terminal of an electronic component, that is transmitted to the other terminal of the electronic component. Accordingly, the proportion of the signal that is lost inside the electronic component out of the signal input to the electronic component increases as the insertion loss increases.

The insertion loss IL81 represents the proportion of a signal that is transmitted to the terminal P2 out of a signal input to the terminal P1. The proportion of the signal, out of the signal input to the terminal P1, transmitted to the terminal P3 also changes similar to the insertion loss IL81. Similar changes are also provided for the insertion loss IL82.

In the frequency band shown in FIG. 4, the insertion losses IL81 and IL82 are both substantially minimum in a vicinity of the frequency f91 (f92). Furthermore, the insertion losses IL81 and IL82 are both substantially maximum in a vicinity of a frequency f93 (>f91). This is because a harmonic wave in a vicinity of the frequency f93 is attenuated by the low pass filter defined by the inductor L11 and the capacitor C21 and by unbalanced signal-balanced signal conversion performed by magnetic coupling. The insertion losses IL81 and IL82 similarly change up to a frequency f94.

The insertion loss IL81 is substantially maximum in a vicinity of a frequency f95 (>f94). The insertion loss IL82 is substantially maximum in a vicinity of a frequency f96 (>f95). In the multilayer balun 100, the frequency at which the attenuation pole is generated is adjusted to be lower than in the multilayer balun 900 through the action of the open line conductor pattern 171.

The frequency f96 of the attenuation pole of the multilayer balun 900 often depends on the parasitic inductance and the parasitic capacitance of the multilayer balun 900. The inductance component and the capacitance component of the open line conductor pattern 171 are almost always larger than the parasitic inductance component and the parasitic capacitance component of the multilayer balun 100. Therefore, the frequency f95 of the attenuation pole of the multilayer balun 100 is usually lower than the frequency f96 of the attenuation pole of the multilayer balun 900. In other words, in almost all cases, the frequency of the attenuation pole is able to be lowered by the open line conductor pattern 171.

As described above, according to the multilayer balun of the present preferred embodiment, the frequency of the attenuation pole can be adjusted while maintaining the pass band. Furthermore, according to the multilayer balun of the present preferred embodiment, the frequency of the attenuation pole can be adjusted by a greater amount.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer balun comprising:
 a plurality of dielectric layers that are stacked in a stacking direction;
 a first terminal to receive an unbalanced signal;
 second and third terminals to receive balanced signals;
 a first inductor that is electrically connected between the first terminal and a ground point;
 a second inductor that is electrically connected between the second terminal and the third terminal and is magnetically coupled with the first inductor; and
 an open line conductor that has one end that is an open end and another end that is electrically connected to a signal path between the first terminal and the ground point; wherein the first inductor and the open line conductor wind around an axis that extends in the stacking direction; and the open line conductor faces the first inductor in the stacking direction.

2. The multilayer balun according to claim 1, wherein the first terminal is connected to an antenna; and the second and third terminals are connected to an RF circuit.

3. The multilayer balun according to claim 1, further comprising at least one ground terminal that is electrically connected to the ground point.

4. The multilayer balun according to claim 1, wherein the plurality of dielectric layers include a first inductor layer on which the first inductor is provided, a second inductor layer on which the second inductor is provided, and a conductor layer on which the open line conductor is provided; and the conductor layer is located between the first inductor layer and the second inductor layer.

5. The multilayer balun according to claim 1, wherein the multilayer balun has a rectangular parallelepiped shape or a substantially rectangular parallelepiped shape.

6. The multilayer balun according to claim 1, further comprising:

a first capacitor that is electrically connected in parallel with the first inductor; and a second capacitor that is electrically connected in parallel with the second inductor.

7. The multilayer balun according to claim 6, further comprising a third capacitor that is electrically connected between a middle portion located between two end portions of the second inductor and the ground point.

8. The multilayer balun according to claim 6, wherein the first capacitor and the second capacitor are defined by capacitor conductor patterns provided on at least two layers of the plurality of dielectric layers.

9. The multilayer balun according to claim 6, wherein the first capacitor and the first inductor define a first LC parallel resonator; and the second capacitor and the second inductor define a second LC parallel resonator.

10. The multilayer balun according to Claim 6, further comprising:

a third inductor that is electrically connected in series with the first inductor and in series with the first capacitor; wherein the first capacitor and the third inductor define a low-pass filter.

11. A multilayer balun comprising:

a plurality of dielectric layers that are stacked in a stacking direction;

a first terminal to receive an unbalanced signal;

second and third terminals to receive balanced signals;

a first inductor that is electrically connected between the first terminal and a ground point;

a second inductor that is electrically connected between the second terminal and the third terminal and is magnetically coupled with the first inductor;

a first capacitor that is electrically connected in parallel with the first inductor;

a second capacitor that is electrically connected in parallel with the second inductor;

a third inductor that is electrically connected in series with the first inductor and in series with the first capacitor; and an open line conductor that has one end that is an open end and another end that is electrically connected to a signal path between the first terminal and the ground point;

wherein the first capacitor and the third inductor define a low-pass filter.

12. A multilayer balun comprising:

a plurality of dielectric layers that are stacked in a stacking direction;

a first terminal to receive an unbalanced signal;

second and third terminals to receive balanced signals;

a first inductor that is electrically connected between the first terminal and a ground point;

a second inductor that is electrically connected between the second terminal and the third terminal and is magnetically coupled with the first inductor; and an open line conductor that has one end that is an open end and another end that is electrically connected to a signal path between the first terminal and the ground point; wherein the plurality of dielectric layers include a first inductor layer on which the first inductor is provided, a second inductor layer on which the second inductor is provided, and a conductor layer on which the open line conductor is provided; and the conductor layer is located between the first inductor layer and the second inductor layer.

13. A multilayer balun comprising:

a plurality of dielectric layers that are stacked in a stacking direction;

a first terminal to receive an unbalanced signal;

second and third terminals to receive balanced signals;

a first inductor that is electrically connected between the first terminal and a ground point;

a second inductor that is electrically connected between the second terminal and the third terminal and is magnetically coupled with the first inductor; and an open line conductor that has one end that is an open end and another end that is electrically connected to a signal path between the first terminal and the ground point; wherein a self-resonant frequency of the open line conductor pattern is higher than a resonant frequency of the multilayer balun.

14. The multilayer balun according to claim 13, wherein the plurality of dielectric layers include a first inductor layer on which the first inductor is provided, a second inductor layer on which the second inductor is provided, and a conductor layer on which the open line conductor is provided; and the conductor layer is located between the first inductor layer and the second inductor layer.

15. The multilayer balun according to claim 13, wherein the first inductor and the open line conductor wind around an axis that extends in the stacking direction; and the open line conductor faces the first inductor in the stacking direction.

16. A multilayer balun comprising:

a plurality of dielectric layers that are stacked in a stacking direction;

a first terminal to receive an unbalanced signal;

second and third terminals to receive balanced signals;

a first inductor that is electrically connected between the first terminal and a ground point;

a second inductor that is electrically connected between the second terminal and the third terminal and is magnetically coupled with the first inductor; and an open line conductor that has one end that is an open end and another end that is electrically connected to a signal path between the first terminal and the ground point; wherein the open line conductor at least partially winds around an axis.

17. The multilayer balun according to claim 16, wherein
the plurality of dielectric layers include a first inductor layer on which the first inductor is provided, a second inductor layer on which the second inductor is provided, and a conductor layer on which the open line conductor is provided; and the conductor layer is located between the first inductor layer and the second inductor layer.

18. The multilayer balun according to claim 16, wherein
the first inductor and the open line conductor wind around an axis that extends in the stacking direction; and the open line conductor faces the first inductor in the stacking direction.

\* \* \* \* \*